United States Patent
Xi et al.

(10) Patent No.: US 7,876,595 B2
(45) Date of Patent: Jan. 25, 2011

(54) MAGNETIC SHIFT REGISTER AS COUNTER AND DATA STORAGE DEVICE

(75) Inventors: Haiwen Xi, Prior Lake, MN (US);
Dimitar V. Dimitrov, Edina, MN (US);
Andreas Roelofs, Eden Prairie, MN (US); Xiaobin Wang, Chanhassen, MN (US); Paul E Anderson, Eden Prairie, MN (US); Hongyue Liu, Maple Grove, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 194 days.

(21) Appl. No.: 12/233,760

(22) Filed: Sep. 19, 2008

(65) Prior Publication Data

US 2010/0073984 A1 Mar. 25, 2010

(51) Int. Cl.
*G11C 19/00* (2006.01)
(52) U.S. Cl. .......................... 365/80; 365/158
(58) Field of Classification Search .......... 365/80, 365/158
See application file for complete search history.

(56) References Cited

U.S. PATENT DOCUMENTS

| 6,834,005 | B1 | 12/2004 | Parkin |
|---|---|---|---|
| 6,898,132 | B2 | 5/2005 | Parkin |
| 6,920,062 | B2 | 7/2005 | Parkin |
| 7,031,178 | B2 | 4/2006 | Parkin |
| 7,236,386 | B2 | 6/2007 | Parkin |
| 2008/0138659 | A1* | 6/2008 | Lim et al. ............... 428/810 |
| 2009/0207718 | A1* | 8/2009 | Joe et al. ............... 369/126 |

OTHER PUBLICATIONS

H. Numata et al., Scalable Cell Technology Utilizing Domain Wall Motion for High-Speed MRAM, 2007 Symposium on VLSI Technology Digest of Technical Papers, pp. 232-233 (2007).
U.S. Appl. No. 12/144,705, filed Jun. 24, 2008, Inventors: Xi et al.

* cited by examiner

*Primary Examiner*—Hoai V Ho
(74) *Attorney, Agent, or Firm*—Campbell Nelson Whipps LLC

(57) ABSTRACT

A register having a track with a first electrode is at the first end to supply a current to the track in a first direction and a second electrode at the second end to supply a current to the track in a second direction, the second direction being opposite to the first direction. A first domain wall anchor and a second domain wall anchor are positioned proximate the track between the first electrode and the second electrode. Each of the domain wall anchors has a ferromagnetic pinned layer and a barrier layer proximate the track, with the barrier layer between the track and the ferromagnetic pinned layer. The ferromagnetic layer has a magnetization orientation pinned perpendicular to the magnetization orientation of the track.

19 Claims, 5 Drawing Sheets

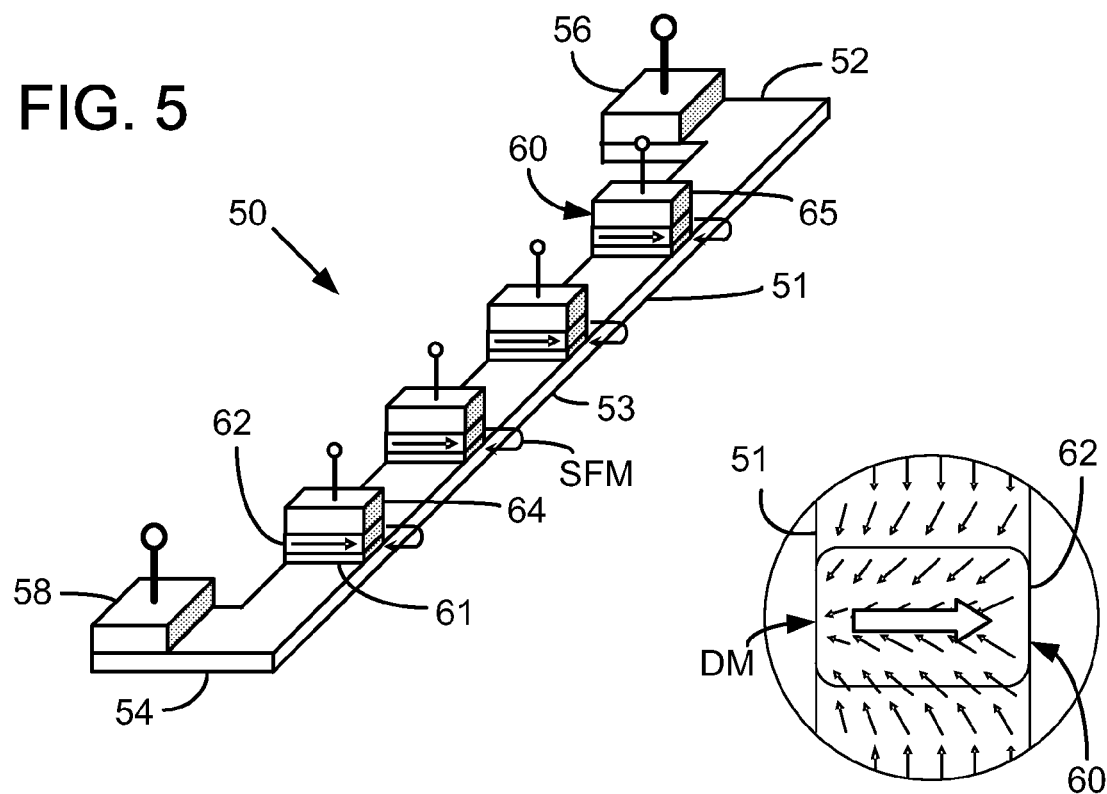
FIG. 5
FIG. 5A
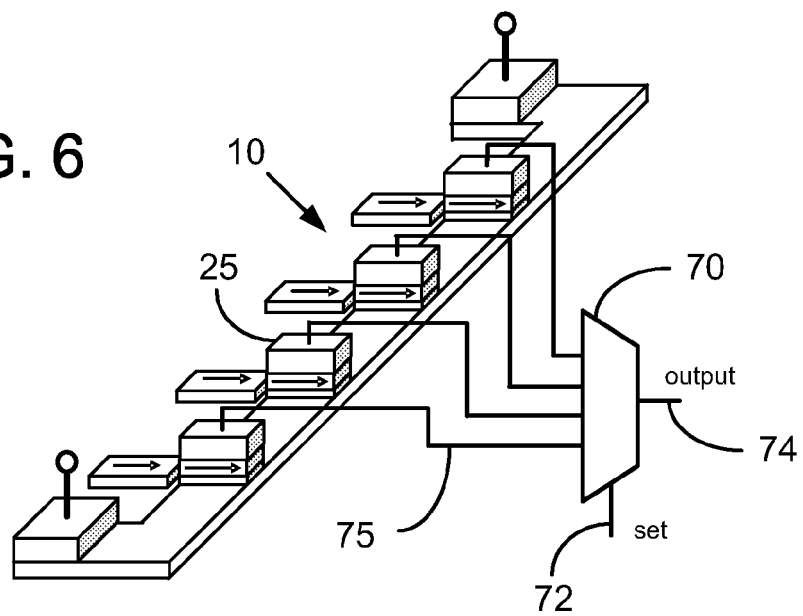
FIG. 6

MAGNETIC SHIFT REGISTER AS COUNTER AND DATA STORAGE DEVICE

BACKGROUND

In recent years, the commercial market for memory has gradually shifted from that for personal, desk top computers to consumer devices such as handheld or portable music players, communication devices, computing devices, and combinations of these features in one device. Due to the smaller and smaller size of these portable devices, memory with higher density and speed, lower power consumption, and small size is in high demand.

Extensive development has been directed to non-volatile memory devices including FLASH, polymer random access memory (RAM), magnetic RAM (MRAM), ferroelectric RAM (FeRAM) and resistance RAM (RRAM). Magnetic shift registers have been proposed as an alternative to these RAM devices, as magnetic shift registers can store and access a large number of data bits using just a few logic elements and a low cost.

In the magnetic shift registers, data writing and reading is accomplished by moving magnetic domain walls to a certain location within a magnetic track by current. To facilitate the storage of data, various embodiments of shift registers include an element in the track to support or stabilize a domain wall at a certain location during idle mode.

There is always room to provide better means to support or stabilize the domain walls.

BRIEF SUMMARY

The present disclosure relates to magnetic shift registers or shift tracks, in which data writing and reading is accomplished by moving magnetic domain walls along the track by electric current. The present disclosure provides magnetic elements as domain wall anchors to stabilize a domain wall at a selected location.

In one particular embodiment, this disclosure provides a shift register having a track comprising a ferromagnetic material and having a switchable magnetization orientation, the track having a first end and a second end. A first electrode is at the first end to supply a current to the track in a first direction and a second electrode is at the second end to supply a current to the track in a second direction, the second direction being opposite to the first direction. A first domain wall anchor to stabilize a domain wall is positioned proximate the track between the first electrode and the second electrode, the first domain wall anchor comprising a first ferromagnetic pinned layer and a first barrier layer proximate the track, with the first barrier layer between the track and the first ferromagnetic pinned layer, the first ferromagnetic layer having a magnetization orientation pinned perpendicular to the magnetization orientation of the track. Also, a second domain wall anchor to stabilize a domain wall is positioned proximate the track between the first domain wall anchor and the second electrode, the second domain wall anchor comprising a second ferromagnetic pinned layer and a second barrier layer proximate the track, with the second barrier layer between the track and the second ferromagnetic pinned layer, the second ferromagnetic layer having a magnetization orientation pinned perpendicular to the magnetization orientation of the track.

In another particular embodiment, this disclosure provides a method that includes providing a magnetic shift register having a ferromagnetic track and at least one domain wall anchor proximate the track, the track comprising a central portion intersecting an arm, with the track having a magnetization orientation and the domain wall anchor having a magnetization. The method includes applying a magnetic field to the magnetic shift register at an angle of about 30-60 degrees to the track to (1) pin the magnetization orientation of the domain wall anchor perpendicular to the magnetization orientation of the track and (2) form a domain wall at the intersection of the track central portion and track arm. The method may further include moving the domain wall from the intersection to the domain wall anchor, which could be done by applying a current in a direction from the track arm to the track central portion.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which:

FIG. 5 is a perspective view of a second embodiment of a magnetic shift register having a magnetic track with four domain wall storage anchors; FIG. 5A is a schematic top view of a domain wall storage anchor of FIG. 5 with a domain wall anchored;

FIG. 6 is a perspective view of a number counting device utilizing the magnetic shift register of FIG. 1;

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
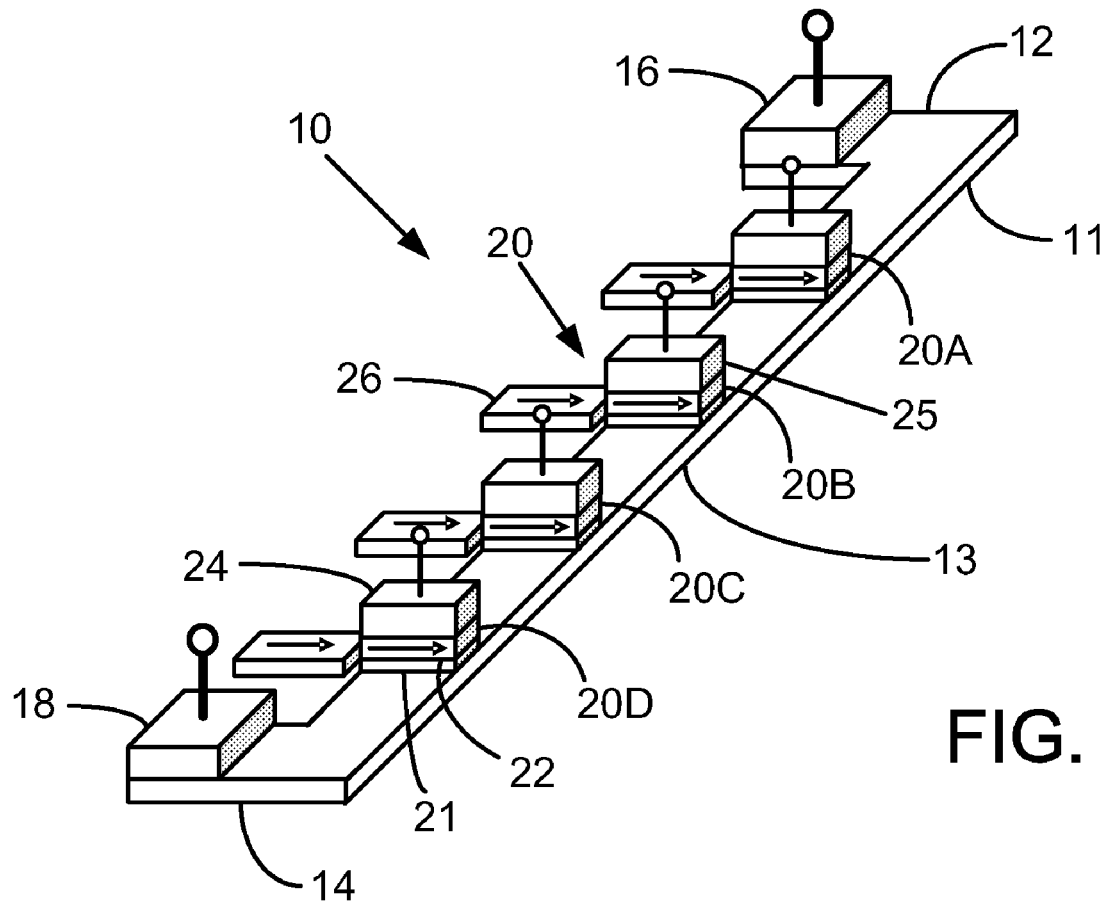
FIG. 1 is a perspective view of a first embodiment of a magnetic shift register having a magnetic track with four domain wall storage anchors, with a portion of each anchor being separate from and positioned proximate the track.

The present disclosure is a memory device that utilizes domain wall motion, based on spin electronics, to write and read data in ferromagnetic material. The shiftable magnetic register has a data track formed of a ferromagnetic strip. The track may be a physically uniform, magnetically homogeneous ferromagnetic material or layers of different ferromagnetic materials. The track is magnetized in small sections, referred to herein as "domains", in one direction or another. Information is stored as direction of magnetic moment within domains in the track.

A domain wall is a concentration of a change in magnetization from one direction to another in a very small space. In a magnetic material with domain walls, a current passed across the domain wall moves the domain wall in the direction of the electron current flow, past a reading or writing element or device. As the electron current passes through a domain wall, the current exerts spin torque on the domain wall and then drags the domain wall to move with it. The domain wall is preferably stabilized at a certain location during its idle mode. The present disclosure provides numerous embodiments for stabilizing a domain wall with wall anchors positioned proximate the magnetic track.

This disclosure provides a shift register that has a track having a switchable magnetization orientation, with a first electrode at the first end to supply a current to the track in a first direction and a second electrode at the second end to supply a current to the track in a second direction, the second direction being opposite to the first direction. At least one domain wall anchor to stabilize a domain wall is positioned proximate the track between the first electrode and the second electrode, the domain wall anchor comprising a ferromagnetic pinned layer and a barrier layer proximate the track, the barrier layer is positioned between the track and the ferromagnetic pinned layer. The ferromagnetic layer has its magnetization orientation pinned perpendicular to the magnetization orientation of the track. The at least one domain wall anchor may include a remote magnet spaced from the track, the remote magnet having a magnetization orientation pinned perpendicular to the magnetization orientation of the track.

This disclosure also provides a shift register that has a track having a switchable magnetization orientation, a first electrode at the first end to supply a current to the track in a first direction and a second electrode at the second end to supply a current to the track in a second direction, the second direction being opposite to the first direction. There is at least one magnetic tunnel junction comprising a ferromagnetic pinned layer, a ferromagnetic free layer, and a barrier layer therebetween, with the track being the free layer. The magnetic tunnel junction stabilizes a domain wall in the track.

In the following description, reference is made to the accompanying set of drawings that form a part hereof and in which are shown by way of illustration these and additional specific embodiments. It is to be understood that other embodiments are contemplated and may be made without departing from the scope or spirit of the present disclosure. The following detailed description, therefore, is not to be taken in a limiting sense. While the present disclosure is not so limited, an appreciation of various aspects of the disclosure will be gained through a discussion of the examples provided below.

Figure 8:
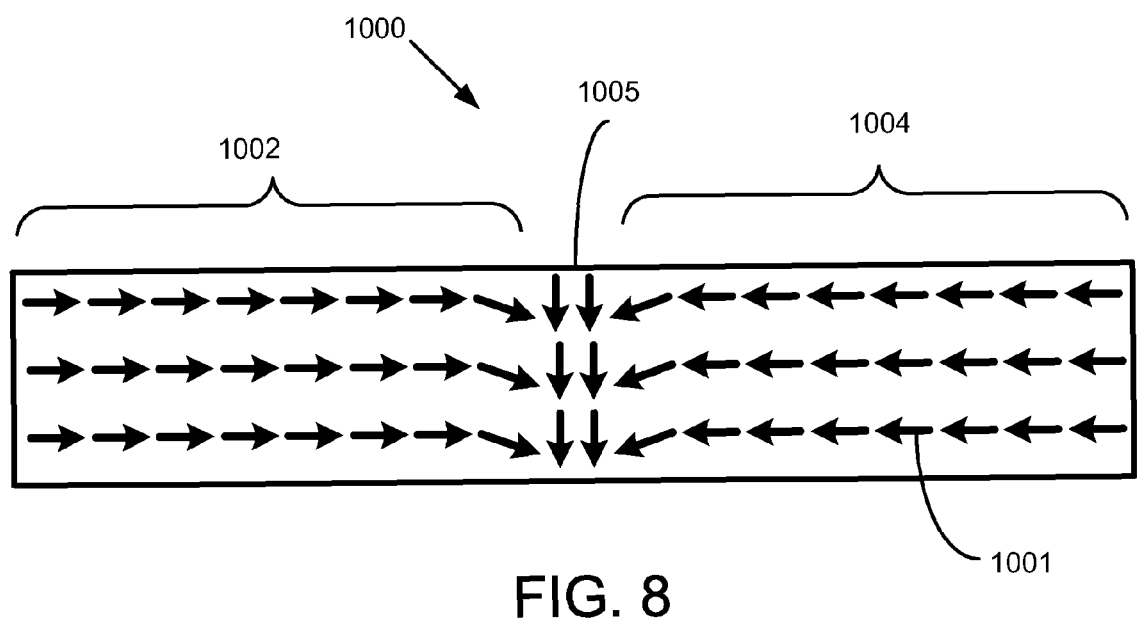
FIG. 8 is a schematic diagram of a magnetic material illustrating two domains and a domain wall.

In magnetic shift registers or shift tracks, data writing and reading is accomplished by moving magnetic domain walls by electric current. An in-plane electric current de-pins the domain wall and moves it to the next location. FIG. 8 illustrates the concept of domains and domain walls as used in conjunction with the present disclosure. FIG. 8 shows an exemplary magnetic material 1000 with two domains 1002, 1004 and a domain wall 1005. The arrows, such as arrow 1001, represent a magnetic moment, or dipole, and indicate local magnetization directions. The magnetic moments in domain 1002 point to the right, while the magnetic moments in domain 1004 point to the left. Domain wall 1005 is the region in which domains 1002, 1004 of opposite polarity meet; this illustrated embodiment is a "head-to-head" domain wall. The change of magnetism between domain 1002 and domain 1004 is concentrated in the small domain wall 1005, creating a large dipolar fringing field emanating from the surface of the layer. This domain wall carries a data bit, in this disclosure, a data bit "1".

FIG. 1 illustrates a magnetic shift register 10 having a magnetic track 11 with a plurality of wall anchors 20, in accordance with this disclosure. Track 11 is generally planar, supported by a substrate. Magnetic track 11 is usually about 50 nm-5 micrometers wide (although thinner and thicker tracks are suitable) with an extended length. In the illustrated embodiment, magnetic track 11 is "U" shaped, having a central portion 13 and arms 12, 14 at either end of central portion 13. This shape may also be referred to as a "racetrack".

Magnetic track 11 is formed from a relatively 'soft' magnetic material, a material with high momentum, low coercivity, low uniaxial anisotropy, and large exchange coupling, the magnetization orientation of which can be altered by being exposed to a magnetic field. Examples of suitable soft magnetic materials include ferromagnetic metals such as Ni, Co, Fe and their alloys such as NiFe, CoFe, CoNiFe, CoFeB, and combinations thereof. For track 11, the magnetization orientation is readily switchable, and extends elongate along the length of track 11, from arm 12, through central portion 13, to arm 14.

At the ends of track 11 (e.g., at arms 12, 14) are first and second electrodes 16, 18, respectively, where electric current can flow in and along track 11. Along track 11 is positioned at least one anchor 20, and in the illustrated embodiment, four anchors 20A, 20B, 20C, 20D. It is understood that more or less anchors 20 may be positioned along track 11. Anchors 20 may be distributed along track 11 in an evenly spaced manner, or have varying spacing therebetween. Anchors 20 may be present on any or all sections of track 11, e.g., central portion 13 and/or arms 12, 14.

Anchors 20 include a barrier layer 21 and a ferromagnetic (FM) layer 22 positioned proximate track 11, with barrier layer 21 positioned between track 11 and FM layer 22. In some embodiments, barrier layer 21 is directly on or adjacent to track 11, with no intervening layers. Similarly, in some embodiments, FM layer 22 is directly on or adjacent to barrier layer 21, with no intervening layers. Electrically connected to FM layer 22 is an electrode layer 24, such as a nonmagnetic metal. Electrode layer 24 is operably connected to a voltage source (not illustrated) to provide a current through anchor 20.

Barrier layer 21 may be a nonmagnetic metallic material or a nonmagnetic metal oxide material; examples of suitable conductive nonmagnetic metallic materials include Cu, Ag, and Au, and examples of suitable insulating oxide and semiconductor barriers include AlO, $Al_2O_3$, TiO, and MgO.

FM layer 22 is formed from a magnetic material that has a magnetization orientation. FM layer 22 may be formed from a 'soft' magnetic material, the magnetization orientation of which can be altered by being exposed to a magnetic field. The material of FM layer 22 is harder than the material of track 11, in that a greater magnetic field is needed to alter the magnetization of FM layer 22 so that it is not as readily switchable as track 11. Thus, FM layer 22 can be referred to as a "pinned layer" relative to track 11, which can be referred to as a "free layer". Examples of suitable magnetic materials for FM layer 22 include ferromagnetic metals such as Ni, Co, Fe and their alloys such as NiFe, CoFe, CoNiFe, CoFeB, and combinations thereof. FM layer 22 may be either a single layer or an unbalanced synthetic antiferromagnetic (SAF) coupled structure, i.e., two ferromagnetic sublayers separated by a metallic spacer, such as Ru or Cu, with the magnetization orientations of the sublayers in opposite directions to provide a net magnetization. Alternately, the material of FM layer 22 may be a hard or permanent magnet (PM), the magnetization orientation of which does not change. Examples of permanent magnet materials include Fe, Cr, Co, Ni, Pt, V, Mn, Bi, and combinations thereof.

Together, FM layer 22, barrier layer 21 and track 11 proximate barrier layer 21 form a magnetic tunnel junction cell (MTJ) 25. In magnetic tunnel junction 25, track 11 is the free layer, the magnetization orientation of which can be readily switched, and FM layer 22 is the pinned layer, having a magnetization orientation which is pinned, relative to track 11. For magnetic shift registers of this disclosure, the magnetization orientation of FM layer 22 is pinned perpendicular to the possible magnetization orientations of track 11.

In this embodiment, anchor 20 also includes, positioned separate from track 11 and magnetic tunnel junction 25, a remote magnet 26; each magnetic tunnel junction 25 has a corresponding remote magnet 26. Remote magnet 26 is electrically spaced from track 11, for example, about 50-500 nm from the side of track 11, and in some embodiments, is co-planar with or in the same plane as track 11. Remote magnet 26 is a hard or permanent magnet (PM), the magnetization orientation of which does not change. Examples of permanent magnet materials include Fe, Cr, Co, Ni, Pt, V, Mn, Bi, and combinations thereof. Alternately, the magnetic material of remote magnet 26 is a 'soft' magnetic material, but harder than the material of track 11, in that a greater magnetic field is needed to alter the magnetization. In some embodiments, the magnetic material of remote magnet 26 is the same as the material of FM layer 22. For magnetic shift registers of this disclosure, the magnetization orientation of remote magnet 26 is pinned perpendicular to the possible magnetization orientations of track 11. Additionally, the magnetization orientation of remote magnet 26 is pinned in the same direction as the magnetization orientation of FM layer 22.

Figure 2:
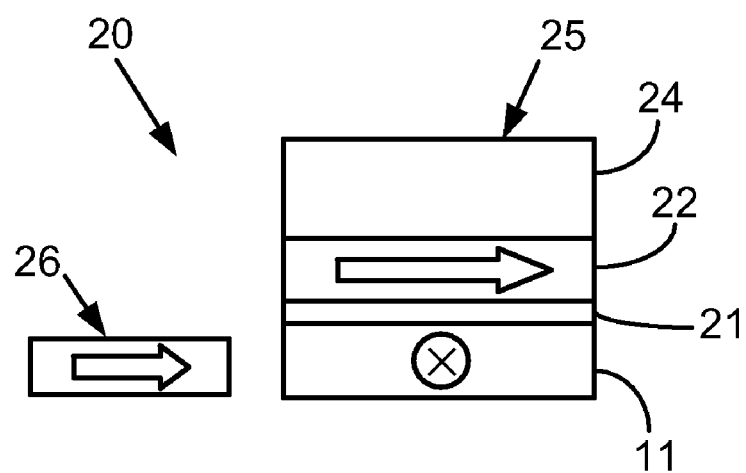
FIG. 2 is a cross-sectional side view of a domain wall storage anchor of FIG. 1.

FIG. 2 shows a cross sectional side view of track 11 anchor 20. Anchor 20 includes magnetic tunnel junction 25 with barrier layer 21, FM layer 22 and electrode layer 24 proximate (e.g., on) track 11, and remote magnet 26 spaced from magnetic tunnel junction 25 and track 11.

Magnetic shift register 10 and its various elements can be made by well-known thin film building and removal techniques such as chemical vapor deposition (CVD), physical vapor deposition (PVD), atomic layer deposition (ALD), photolithography, dry etching, wet etching, and/or ion milling.

Figures 3A, 3B, 3C, 3D:
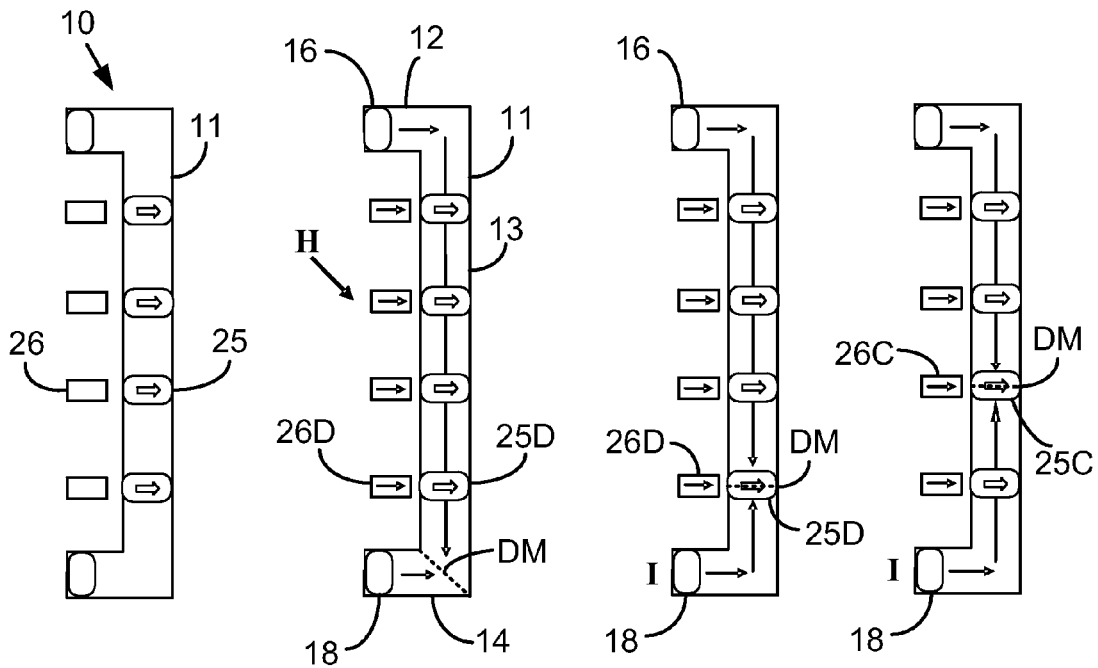
FIGS. 3A-3D are top views of the magnetic shift register of FIG. 1 illustrating a stepwise progression of a domain wall along the magnetic track.

The initiation and writing process of magnetic shift register device 10 is shown in FIGS. 3A through 3D, which are schematic, top-down views of shift register 10 of FIG. 1; the following discussion also refers back to FIG. 1. In this embodiment as shown in FIG. 3A, immediately after fabrication, remote magnet 26 does not have a magnetization orientation whereas FM layer 22 of magnetic tunnel junction 25 has a magnetization orientation illustrated; other embodiments may have a magnetization orientation for remote magnet 26 and/or no set magnetization orientation for FM layer 22. After shift register 10 is fabricated, a strong external magnetic field "H" is applied in-plane of track 11. Field H is applied in such a direction that it makes an angle (for example, in the range of about 15-75 degrees, in some embodiments about 30-60 degrees, and in some embodiments, about 45 degrees), with respect to the part of track 11 where magnetic tunnel junctions 25 reside. Therefore, due to magnetic field H, the magnetizations of remote magnets 26 and of FM layer 22 of magnetic tunnel junctions 25 are aligned by the field as shown in FIG. 3B. The magnetization orientation of track 11, in the presence of field H is also shown in FIG. 3B. A head-to-head domain wall "DM" is formed at the intersection of central portion 13 and arm 14 of track 11 due to the head-to-head meeting of the magnetization orientations of central portion 13 and arm 14. After magnetic field H is removed, domain wall DM remains at the intersection.

In FIG. 3C, an electron current pulse "I" is applied into track 11 from electrode 18; this current is in the opposite direction of the magnetization in track portion 13 set by field "H". A current passed across a domain wall moves the domain wall in the direction of the current. Thus, domain wall DM is moved, in track 11, away from the intersection via the current. Stray magnetic field from remote magnet 26 (specifically, remote magnet 26D) attracts domain wall DM and stabilizes it close to magnetic tunnel junction 25 (specifically, magnetic tunnel junction 25D). The stabilization magnetic field from remote magnet 26 can be relatively low (e.g., on the order of about 10 Oe), since the magnetic field needed to move domain wall DM is usually in the order of 10 Oe. The stray field strength of remote magnet 26 can be designed based on the saturation magnetization of remote magnet 26 and its size, thickness, and the distance of remote magnet 26 from track 11.

To move domain wall DM to the next position, i.e., proximate anchor 20C (FIG. 1) and magnetic tunnel junction 25C, an electron current pulse "I" is again applied in the same direction from electrode 18 (see FIG. 3D). To move domain wall DM from anchor 20C back to anchor 20D (FIG. 1), an electron current pulse with the opposite direction is applied.

Figure 4A:
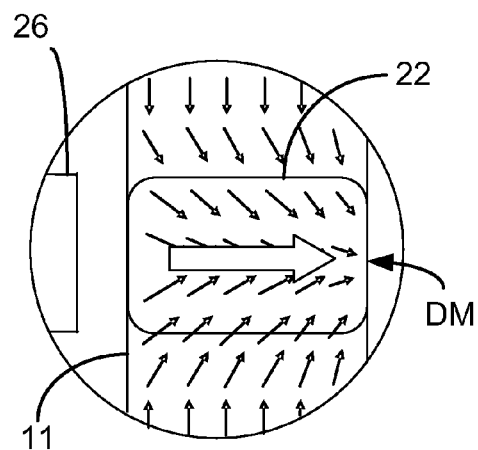
FIGS. 4A and 4B are schematic top views of a domain wall storage anchor of FIG. 1 with a domain wall anchored in FIG. 4A and with no domain wall present in FIG. 4B.
Figure 4B:
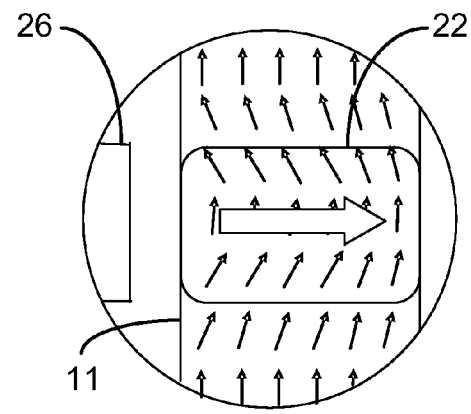

At each of anchor 20 locations, domain wall DM is the location of a head-to-head meeting of magnetization orientations within track 11. FIG. 4A shows the magnetization configuration of a head-to-head domain wall DM within track 11 proximate (e.g., underneath) FM layer 22. FIG. 4B shows the magnetization of track 11 proximate (e.g., underneath) FM layer 22 when the domain wall is absent. The difference of the magnetic track magnetization configurations with and without domain wall DM present can readily be seen in the figures and results in a difference in magnetic tunnel junction resistance. The magnetic tunnel junction resistance with a domain wall present (i.e., as in FIG. 4A) is lower than that without domain wall present (i.e., as in FIG. 4B). In this embodiment, having a domain wall present represents a data bit "1".

The data stored in magnetic shift register 10 is represented by the position of domain wall DM. Since domain wall DM is present in track 11, proximate (e.g., underneath) one of magnetic tunnel junctions 25, the number of magnetic tunnel junctions 25 is the number of the states of shift register 10.

To read the state of a magnetic tunnel junction 25, and thus determine a location of domain wall DM, a current is applied from one of the ports, e.g., electrode 18, through magnetic track 11 and out from electrode layer 24 of magnetic tunnel junction 25, and the resistance of that magnetic tunnel junction 25 is measured. The process will be done sequentially for all magnetic tunnel junctions 25 in shift register 10.

FIG. 5 illustrates an alternate embodiment of a magnetic shift register having domain wall anchors. In FIG. 5, magnetic shift register 50 includes a track 51 having at least one domain wall storage anchor 60. The various elements of shift register 50 are similar to and have the same or similar properties and features as the corresponding elements of shift register 10 described above, unless indicated otherwise.

In the illustrated embodiment, magnetic track 51 is "U" shaped, having a central portion 53 and arms 52, 54 at either end of central portion 53. A first electrode 56 and second electrode 58 are positioned at arms 52, 54, respectively. Positioned on track 51 (with or without intervening layers) is anchor 60. Unlike anchors 20 from shift register 10 (FIG. 1), domain wall anchors 60 of FIG. 5 have no remote magnet, but rather, anchor 60 has only a magnetic tunnel junction 65 similar to magnetic tunnel junction 25. Tunnel junction 65 include a barrier layer 61 and a ferromagnetic (FM) layer 62 positioned proximate track 51, with barrier layer 61 positioned between track 51 and FM layer 62. In some embodiments, barrier layer 61 is directly on or adjacent to track 51, with no intervening layers. Similarly, in some embodiments, FM layer 62 is directly on or adjacent to barrier layer 61, with no intervening layers. Electrically connected to FM layer 62 is an electrode layer 64, such as a nonmagnetic metal. Electrode layer 64 is operably connected to a voltage source (not illustrated) to provide a current through anchor 60.

Track 51 and FM layer 62 have magnetization orientations associated with them. For track 51, the magnetization orientation is readily switchable, and extends along the length of track 51, from electrode 56 at arm 52, through central portion 53, to electrode 58 at arm 54. Magnetic tunnel junction 65 has a configuration (e.g., shape, size, etc.) so that its magnetic easy axes is normal (e.g., perpendicular) to track 51.

For shift register 50, where the magnetic tunnel junction 65 is anchor 50 with no remote magnet, FM layer 62 provides a stray field that is sufficiently strong to attract and stabilize the domain wall when both external magnetic field (from a remote magnet) and electric current are absent. This can be accomplished because FM layer 62 has a large volume, which has a magnetization sufficient to stabilize the domain wall.

As illustrated in FIG. 5, the stray field from FM layer 62 (identified as SFM in FIG. 5) is opposite to the magnetization of FM layer 62 itself. Thus, a head-to-head domain wall underneath anchor 60 will be oriented in the opposite direction to that in FIG. 4A. FIG. 5A illustrates domain wall DM in track 51 in an opposite (antiparallel) direction to the magnetization orientation of FM layer 62. Therefore, in this embodiment, the magnetic tunnel junction resistance is higher when the domain wall present than when it is not present.

The magnetic shift registers of this disclosure (e.g., shift registers 10, 50) can also function as a number counter. Using shift register 10 of FIG. 1 as an example, a stored number is represented by the location of the domain wall DM within shift register 10. For example, a domain wall DM is present proximate or underneath magnetic tunnel junction 25n. The state of shift register 10 can be changed by moving domain wall DM, e.g., by applying an electron current pulse from electrode 18 to electrode 16. The domain wall DM is moved by the current to the next anchor 20, magnetic tunnel junction 25n+1, and the counter is increased in number by one, i.e., from n to n+1. Similarly, an electron current pulse with the opposite direction will decrease the counter by one. After the domain wall has moved the length of this first shift register (e.g., register 10) and the counter is maxed out, a bit is passed to a second shifter register and the first shift register is reset to zero. The domain wall is sent to the location for zero by an electron current pulse; the location for zero may be, for example, the intersection of arm 12 and central portion 13 of track 11.

A read operation of shifter register 10 is shown in FIG. 6 with all magnetic tunnel junctions 25 connected to a multiplexer (MUX) 70 via input line 75. The set 72 of multiplexer 70 selects the input for output 74 sequentially and then the number saved in the counter, i.e., the state of the shift register represented by the domain wall location, is read out.

Figure 7:
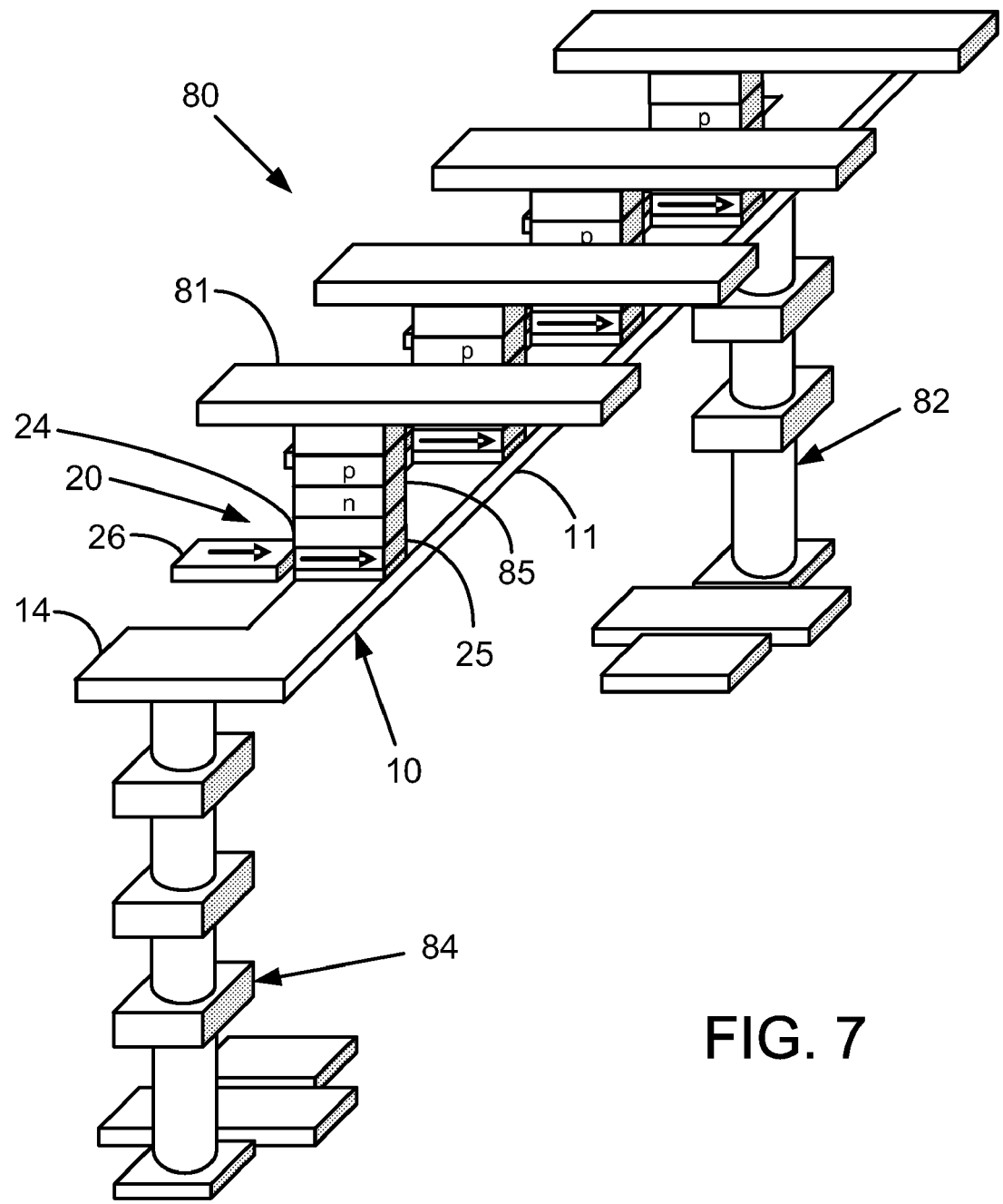
FIG. 7 is a perspective view of a memory array utilizing the magnetic shift register of FIG. 1.

A memory array can be made of a series (matrix) of magnetic shift registers. FIG. 7 shows one magnetic shift register 10 (from FIG. 1) in the array that is connected to other shift register(s) (not illustrated) by bitlines, typically in parallel. The plurality of magnetic shift registers in the array could be the same or different. As illustrated in FIG. 1 and discussed above, shift register 10 has track 11 with a plurality of anchors 20 thereon, each anchor 20 having a tunnel junction 25 and remote magnet 26. In this memory array 80, each magnetic tunnel junction 25 of anchor 20 is electrically connected to a bitline 81. Shift register 10 is connected to a control transistor at each end, specifically arm 12 of track 11 (not visible in FIG. 7, see FIG. 1) is connected to control transistor 82 and arm 14 of track 11 is connected to control transistor 84. To avoid any sneaky current paths and/or inhibit current leakage, a p-n junction or p-n diode 85 can be present proximate electrode layer 24 of each anchor 20. P-n junction or p-n diode 85 may be integrated on top of electrode layer 24.

For the write process, control transistors 82, 84 are turned on so that an electron current flows along track 11 to move the domain wall from one anchor 20 to another.

For the read process, one control transistor (e.g., control transistor 82) is turned on and the other one (e.g., control transistor 84) is off. Then, a magnetic tunnel junction 25 is selected by activating its corresponding transistor (not shown in the figure) for the respective bitline 81. An electron current flows from the activated control transistor (e.g., control transistor 82), through track 11 and selected magnetic tunnel junction 25 and returns from bitline 81. Then, sequentially, the resistance of each of magnetic tunnel junctions 25 is measured to determine the location of the domain wall and the data stored in shift register 10.

The various embodiments of magnetic shift register devices and arrays of this disclosure may be made by well-known thin film building and removal techniques such as chemical vapor deposition (CVD), physical vapor deposition (PVD), atomic layer deposition (ALD), photolithography, dry etching, wet etching, or ion milling.

Thus, embodiments of the MAGNETIC SHIFT REGISTER AS COUNTER AND DATA STORAGE DEVICE are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A shift register comprising:
   a track comprising a ferromagnetic material and having a switchable magnetization orientation, the track having a first end and a second end;
   a first electrode at the first end and a second electrode at the second end to supply a first current to the track in a first direction and to supply a second current in a second direction, the second direction being opposite to the first direction;
   a first domain wall anchor to stabilize a domain wall positioned proximate the track between the first electrode and the second electrode, the first domain wall anchor comprising a first ferromagnetic pinned layer, a first barrier layer proximate the track, and a first remote magnet electrically spaced from the track, the first barrier layer positioned between the track and the first ferromagnetic pinned layer, the first ferromagnetic layer having a magnetization orientation pinned perpendicular to the magnetization orientation of the track, and the first remote magnet having a magnetization orientation pinned perpendicular to the magnetization orientation of the track; and
   a second domain wall anchor to stabilize a domain wall positioned proximate the track between the first domain wall anchor and the second electrode, the second domain wall anchor comprising a second ferromagnetic pinned layer, a second barrier layer proximate the track, and a second remote magnet electrically spaced from the track, the second barrier layer positioned between the track and the second ferromagnetic pinned layer, the second ferromagnetic layer having a magnetization orientation pinned perpendicular to the magnetization orientation of the track, and the second remote magnet having a magnetization orientation pinned perpendicular to the magnetization orientation of the track.

2. The shift register of claim 1 further comprising a third domain wall anchor proximate the track between the second domain wall anchor and the second electrode, the third domain wall anchor comprising a third ferromagnetic pinned layer, a third barrier layer proximate the track, and a third remote magnet electrically spaced from the track, the third barrier layer positioned between the track and the third ferromagnetic pinned layer, the third ferromagnetic layer having a magnetization orientation pinned perpendicular to the magnetization orientation of the track, and the third remote magnet having a magnetization orientation pinned perpendicular to the magnetization orientation of the track.

3. The shift register of claim 2 further comprising a fourth domain wall anchor proximate the track between the third domain wall anchor and the second electrode, the fourth domain wall anchor comprising a fourth ferromagnetic pinned layer, a fourth barrier layer proximate the track, and a fourth remote magnet electrically spaced from the track, the fourth barrier layer positioned between the track and the fourth ferromagnetic pinned layer, the fourth ferromagnetic layer having a magnetization orientation pinned perpendicular to the magnetization orientation of the track, and the fourth remote magnet having a magnetization orientation pinned perpendicular to the magnetization orientation of the track.

4. The shift register of claim 1 wherein the first and second remote magnets are spaced about 50-500 nm from the track.

5. The shift register of claim 1 wherein the magnetic track is U shaped, comprising a central portion, a first arm having the first electrode thereat and a second arm having the second electrode thereat.

6. The shift register of claim 1, wherein when an electric current is applied to the track in the first direction, a domain wall shifts from the first domain wall anchor to the second domain wall anchor.

7. A shift register comprising:
a track comprising a ferromagnetic material and having a switchable magnetization orientation, the track having a first end and a second end;
a first electrode at the first end and a second electrode at the second end to supply a first current to the track in a first direction and to supply a second current in a second direction, the second direction being opposite to the first direction;
a first magnetic tunnel junction comprising a first ferromagnetic pinned layer, a first ferromagnetic free layer, and a first barrier layer therebetween, the track being the first free layer; and
a second magnetic tunnel junction comprising a second ferromagnetic pinned layer, a second ferromagnetic free layer, and a second barrier layer therebetween, the track being the second free layer;
wherein the first magnetic tunnel junction and the second magnetic tunnel junction stabilize a domain wall in the track, and wherein the first ferromagnetic pinned layer and the second ferromagnetic pinned layer each have a magnetization orientation pinned perpendicular to the magnetization orientation of the track.

8. The shift register of claim 7 further comprising a third magnetic tunnel junction comprising a third ferromagnetic pinned layer, a third ferromagnetic free layer, and a third barrier layer therebetween, the track being the third free layer.

9. The shift register of claim 8 wherein the third ferromagnetic pinned layer has a magnetization orientation pinned perpendicular to the magnetization orientation of the track.

10. The shift register of claim 7 further comprising a fourth magnetic tunnel junction comprising a fourth ferromagnetic pinned layer, a fourth ferromagnetic free layer, and a fourth barrier layer therebetween, the track being the fourth free layer.

11. The shift register of claim 10 wherein the fourth ferromagnetic pinned layer has a magnetization orientation pinned perpendicular to the magnetization orientation of the track.

12. The shift register of claim 7, wherein when an electric current is applied to the track, a domain wall shifts from the first magnetic tunnel junction to the second magnetic tunnel junction.

13. A method comprising:
providing a magnetic shift register having a ferromagnetic track and at least one domain wall anchor proximate the track, the track comprising a central portion intersecting an arm, the track having a magnetization orientation and the domain wall anchor having a magnetization;
applying an external magnetic field to the magnetic shift register at an angle of about 30-60 degrees to the track to:
(a) pin the magnetization orientation of the domain wall anchor perpendicular to the magnetization orientation of the track; and
(b) form a domain wall at the intersection of the track central portion and track arm.

14. The method of claim 13 further comprising:
moving the domain wall from the intersection to the domain wall anchor.

15. The method of claim 14 wherein moving the domain wall from the intersection to the domain wall anchor comprises:
applying a current in a direction from the track arm to the track central portion.

16. The shift register of claim 1, wherein the first and second remote magnets are co-planar with the track.

17. The shift register of claim 1, wherein the magnetization of the first and second remote magnets does not change.

18. The shift register of claim 1, wherein the first and second remote magnets comprise Fe, Cr, Co, Ni, Pt, V, Mn, Bi, or combinations thereof.

19. The shift register of claim 7, wherein the ferromagnetic pinned layers of the first and second magnetic tunnel junctions have magnetization sufficient to stabilize the domain wall.

* * * * *